(12) United States Patent
Fancsali et al.

(10) Patent No.: US 8,690,395 B2
(45) Date of Patent: Apr. 8, 2014

(54) EFFICIENT LIGHT EMITTING DEVICE AND METHOD FOR MANUFACTURING SUCH A DEVICE

(75) Inventors: Erno Fancsali, Eindhoven (NL); Willem Hendrik Smits, Eindhoven (NL); Pascal Jean Henri Bloemen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 174 days.

(21) Appl. No.: 13/375,673

(22) PCT Filed: May 27, 2010

(86) PCT No.: PCT/IB2010/052365
§ 371 (c)(1), (2), (4) Date: Dec. 1, 2011

(87) PCT Pub. No.: WO2010/143093
PCT Pub. Date: Dec. 16, 2010

(65) Prior Publication Data
US 2012/0087106 A1     Apr. 12, 2012

(30) Foreign Application Priority Data
Jun. 4, 2009 (EP) .................................. 09161945

(51) Int. Cl.
*F21V 3/00* (2006.01)
(52) U.S. Cl.
USPC ........ 362/311.02; 362/84; 362/231; 362/293; 362/337
(58) Field of Classification Search
USPC .................. 362/84, 231, 293, 311.02, 337
See application file for complete search history.

(56) References Cited

U.S. PATENT DOCUMENTS 8,168,998 B2    5/2012    David
(Continued)

FOREIGN PATENT DOCUMENTS

| EP | 1840977 A1 | 10/2007 |
|---|---|---|
| JP | 2006286701 A | 10/2006 |
| WO | 2008060586 A2 | 5/2008 |

OTHER PUBLICATIONS

Allen et al, "ELiXIR—Solid-State Luminaire with Enhanced Light Extraction.." Journal of Display Technology, IEEE Service Center, NY.NY vol. 3, No. 2, Jun. 1, 2007.

(Continued)

*Primary Examiner* — Stephen F Husar
*Assistant Examiner* — Meghan Dunwiddie

(57) ABSTRACT

The invention relates to a light emitting device (2) comprising a primary light source (10), a light converting medium (14) and an optical structure (16). The primary light source is disposed on a substrate (11). The light converting medium comprising phosphors (14) is arranged for converting at least a part of the primary light to secondary light (II) of a different wavelength. The light converting medium is in a remote phosphor configuration. The optical structure is arranged for receiving a part of the secondary light (II) from the light converting medium and is configured for redirecting the part of the secondary light in a direction towards the first plane but away for the primary light source (10). By providing an optical structure redirecting the secondary light away from the primary light source, absorption of the secondary light by the primary light source can be substantially reduced or eliminated. The luminous efficacy is improved by redirecting this secondary light in a direction such that it is transmitted from the light emitting device.

13 Claims, 3 Drawing Sheets

(56) References Cited

U.S. PATENT DOCUMENTS

| | | |
|---|---|---|
| 2007/0012940 A1 | 1/2007 | Suh et al. |
| 2008/0049430 A1 | 2/2008 | Sakumoto |
| 2008/0094829 A1 | 4/2008 | Narendran et al. |
| 2009/0001399 A1 | 1/2009 | Diana et al. |

OTHER PUBLICATIONS

Allen et al, "A Nearly Ideal Phosphor-Converted White Light Emitting Diode" Applied Physics Letters. vol. 92, No. 14, Apr. 7, 2008.

Kang et al, "Modeling White Light-Emitting Diodes.." Applied Physics Letters vol. 89, (2006).

"Strongly Enhanced Phosphor Efficiency in GaInN White Light Emitting Diodes.." Kim et al I, Japanese Journal of Applied Physics, vol. 44, No. 21, 2005 p. 649-651.

EFFICIENT LIGHT EMITTING DEVICE AND METHOD FOR MANUFACTURING SUCH A DEVICE

FIELD OF THE INVENTION

The invention relates to the field of light emitting devices and methods for manufacturing such devices. Such devices may e.g. be used for illumination applications. More specifically, the invention relates to improving the efficacy of light emitting devices, wherein light of a primary light source is converted to secondary light by using a light converting medium.

BACKGROUND OF THE INVENTION

The use of solid state light sources, comprising e.g. light emitting diodes (LED), for illumination and other applications increases rapidly. Solid state lighting holds the promise of providing very efficient illumination devices and technological progress is aimed to further improve the efficacy of the light emitting devices used in such illumination devices.

Often, the illumination devices for such applications are required to provide white light. One approach to obtain such illumination devices is to convert at least a part of the primary light of the solid state light sources to secondary light using phosphor species. White light may be obtained by partial conversion of a blue light with a wavelength converting material comprising such a phosphor. The blue light, emitted e.g. by a light emitting diode (LED) is partially absorbed by the phosphor, causing the phosphor to emit light of a different color, e.g. a yellow light. The blue light emitted by the LED is mixed with the yellow light emitted by the phosphor, and the viewer perceives the resulting mixture of the blue and yellow light as a white light.

The phosphor species, however, emit the secondary light (e.g. the yellow light) with an isotropic light distribution pattern (i.e. the secondary light is emitted over a solid angle of 4 pi). Therefore, at least a part of the secondary light is emitted back in the direction of the primary light source and may be absorbed, thereby reducing the efficacy of the light emitting device. The absorption of the secondary light may be as high as 50%. US 2009/0001399 discloses a method for increasing the luminous efficacy of a white light emitting diode using a LED die and a phosphor. Primary light is emitted by the LED die and converted to secondary light by the phosphor. At least one additional layer or material is provided between the LED die and the phosphor that is transparent for the primary light from the LED die and reflective for the secondary light of the phosphor. The additional layer or material may reduce the absorption of the secondary light.

The transparency and the reflectivity of the additional layer or material for the primary light and secondary light, respectively, are not optimal. Therefore, the efficacy of the light emitting device can still be further improved.

SUMMARY OF THE INVENTION

A light emitting device comprising a primary light source, a light converting medium and an optical structure are disclosed. The primary light source, arranged for emitting primary light, is disposed in a first plane (defined by e.g. a carrier for the primary light source). The light converting medium is arranged for converting at least a part of the primary light to secondary light of a wavelength different from the wavelength of the primary light. The light converting medium is disposed in a second plane at a distance from the primary light source. The optical structure is arranged for receiving a part of the secondary light from the light converting medium and is configured for redirecting the part of the secondary light in a direction towards the first plane and away from the primary light source to enable transmission of the secondary light.

An illumination device for illuminating an area or a room comprising such a light emitting device is also disclosed.

A method for manufacturing a light emitting device is also disclosed. The manufacturing steps include providing a primary light source on a carrier for providing primary light and disposing a light converting medium at a distance from the primary light source. The light converting medium is capable of converting at least a part of the primary light to secondary light of a wavelength different from the wavelength of the primary light. An optical structure is provided that faces the primary light source. The optical structure is arranged for receiving a part of the secondary light from the light converting medium and for redirecting the part of the secondary light in a direction towards the carrier and away from the primary light source.

By providing an optical structure configured for redirecting the secondary light away from the primary light source, absorption of the secondary light by the primary light source can be substantially reduced or eliminated without requiring an intermediate layer or material. The structural variation of a part of the light emitting device provides for the redirection of the secondary light away from the primary light source. The luminous efficacy may be improved by redirecting this secondary light in a direction such that it is transmitted from the light emitting device either directly or indirectly, i.e. via a further redirecting structure.

An example of an optical structure would be a Fresnel lens type structure.

It should be appreciated that at least one of the first plane and second plane may comprise e.g. a curved plane. An example of a second non-planar plane is provided by the dome-shaped light conversion material that will be further described below.

Embodiments of a light emitting device comprising, a primary light source for emitting primary light, the primary light source being disposed in a first plane, a light converting medium arranged for converting at least a part of the primary light to secondary light of a wavelength different from the wavelength of the primary light, wherein the light converting medium is disposed in a second plane at a distance from the first plane and an optical structure comprising a refractive structure or a plurality of surfaces the surfaces being oriented such that the part of the secondary light is redirected in the direction towards the first plane defining an area at least partially surrounding the primary light source. The optical structure disposed between the first plane and the second plane. The optical structure is arranged for receiving a part of the secondary light from the light converting medium and for redirecting the part of the secondary light in a direction towards the first plane and away from the primary light source to enable transmission of the secondary light. These embodiments provide for an effective optical structure that enables redirection of the part of the secondary light, while being substantially independent of considerations for this structure regarding transparency for primary light and reflectivity for the part of the secondary light.

These embodiments described above can be constructed via a method for manufacturing a light emitting device comprising the steps of providing a primary light source on a carrier for providing primary light, disposing a light converting medium at a distance from the carrier, the light converting medium being capable of converting at least a part of the primary light to secondary light of a wavelength different from the wavelength of the primary light and providing an optical structure facing the primary light source, wherein the optical structure is arranged for receiving a part of the secondary light from the light converting medium and for redirecting the part of the secondary light in a direction towards the carrier and away from the primary light source. The optical structure is modified providing the optical structure in a component, wherein the optical structure is obtained by shaping the component to provide a plurality of surfaces the surfaces being oriented such that the part of the secondary light is redirected in the direction towards the first plane defining an area at least partially surrounding the primary light source.

The embodiments above may be furthered modified wherein the light converting medium and the optical structure form an integrated body. This modification is beneficial from a manufacturing point. Furthermore, the optical structure may be formed in the light converting medium.

The embodiment may be furthered modified wherein the light converting medium is comprised in a component at least partially surrounding the primary light source. This modification is advantageous in that the primary light is effectively intercepted by the component comprising the light converting medium.

The embodiment may be furthered modified wherein the component is a dome-shaped component. The modification is beneficial in that the optical path for the primary light in the light converting medium is substantially identical for all emitting angles thereby allowing equal generation of the secondary light over the component.

The embodiment may be furthered modified wherein the component comprises plastic, ceramic material or silicon material. The modification provides for components that can relatively easily and economically efficiently be shaped to provide the optical structure.

The embodiment may also comprise a space defining an air-gap between the primary light source and the light converting medium. The modification provides the advantage of further reducing the amount of light towards the primary light source, therefore reducing absorption losses.

The embodiment may also comprise a reflector arranged for receiving the part of the secondary light redirected by the optical structure or modified wherein the reflector is arranged substantially in or parallel to the first plane at least partially surrounding the primary light source. These changes provide means for further redirection of the redirected part of the secondary light for increasing the efficacy of the light emitting device. The reflectivity of the reflective part is at least 95%.

WO 2008/060586 discloses an embodiment of a remote phosphor light emitting device wherein the phosphor layer has been roughened on an interface towards the primary light source. The roughened phosphor layer is intended to improve the conversion efficiency of the phosphor layer by reducing the reflection of the primary light, i.e. not to (re)-direct the secondary light. For secondary light, the roughened phosphor layer would again provide a Lambertian light distribution of secondary light, such that a significant amount of this secondary light would still hit the primary light source.

DETAILED DESCRIPTION OF THE DRAWINGS

Figure 1:
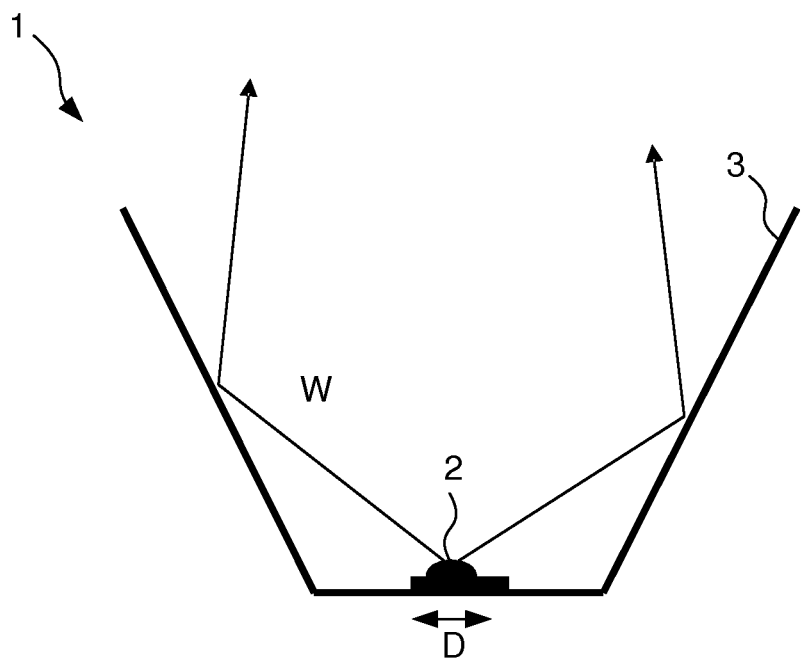
FIG. 1 provides a schematic illustration of an illumination device comprising a light emitting device according to an embodiment of the invention.

FIG. 1 is a schematic illustration of an illumination device 1 configured for an illumination application, e.g. for illuminating an area or space. The illumination device 1 comprises a light emitting device 2 and reflective surfaces 3, such as dichroic mirrors or reflectors. In order to make optimal use of the reflective surfaces 3, the diameter D of the light emitting device 2 is preferably small, approximating a point source.

Figure 2:
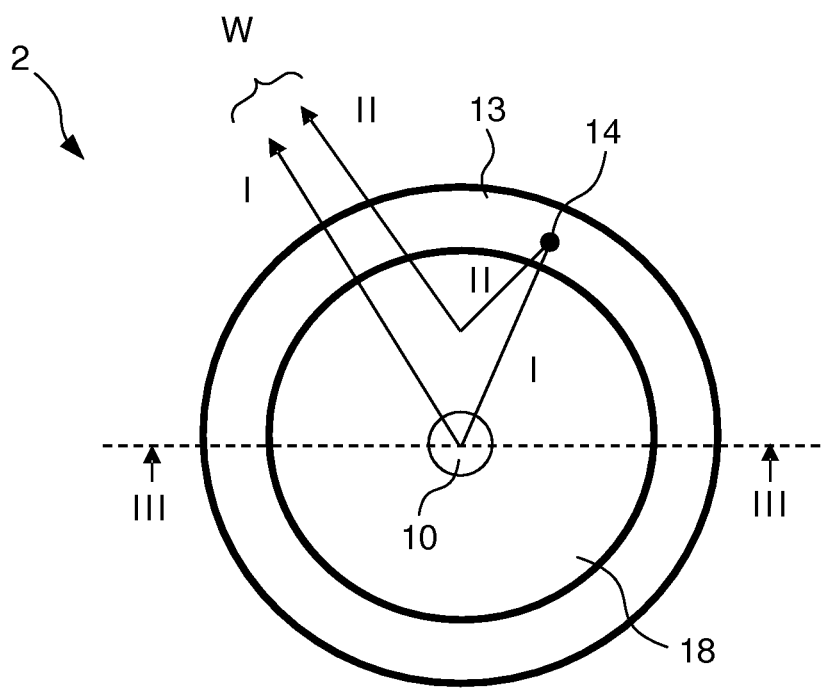
FIG. 2 provides a schematic illustration of a top view of a light emitting device according to an embodiment of the invention.
Figure 3A:
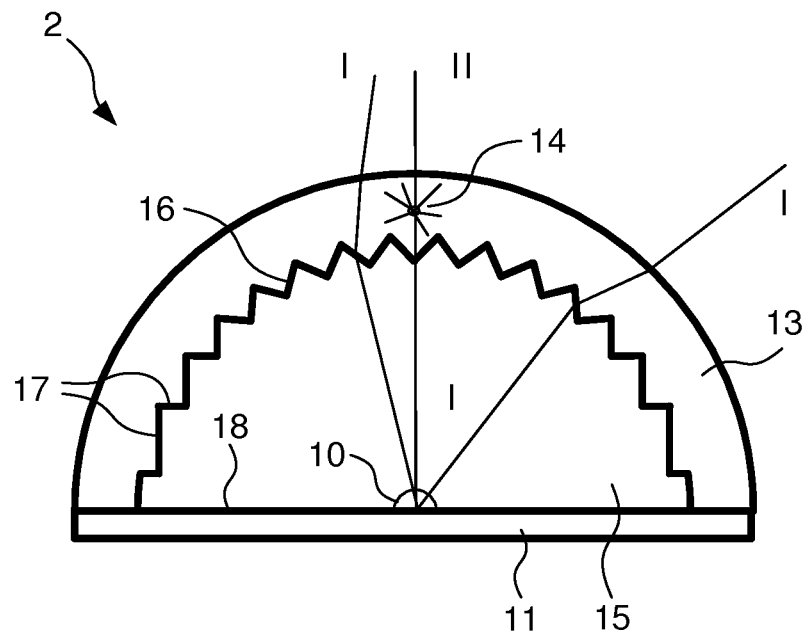
FIGS. 3A and 3B provide schematic illustrations of a cross-section of the light emitting device of FIG. 2 along III-III.
Figure 3B:
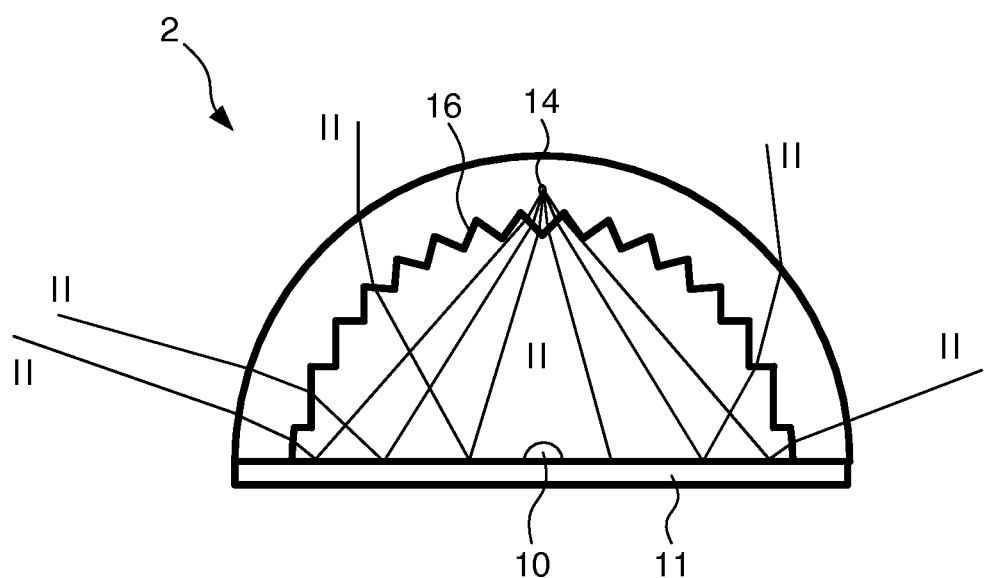

FIG. 2 provides a top view of the light emitting device 2 of the illumination device 1. FIGS. 3A and 3B are cross-sections along line III-III in FIG. 2.

The light emitting device 2 comprises a primary light source 10 provided on a substrate 11. The primary light source 10 may comprise one or more light emitting diodes arranged to allow current to be conveyed through these diodes. As a result, the diodes emit primary light I of a first wavelength (e.g. blue light in the wavelength range of 360 nm to 480 nm, e.g. 460 nm). It should be appreciated that the diodes do not necessarily all emit primary light of a single wavelength. Hybrid solutions can be envisaged wherein some diodes emit light of a first wavelength (e.g. blue light) and other diodes emit light of a different wavelength (e.g. red light). An encapsulating material (not shown) may be provided over the diode(s), e.g. silicon, to enhance out coupling of the primary light from the diode(s).

The light emitting device 2 has a so-called remote phosphor configuration, wherein a component 13 containing phosphor substances 14 is disposed at a distance from the primary light source 10. In other words, the primary light source 10 is located in a first plane, whereas the phosphor substances are defined in a second (curved) plane remote from the first plane. A typical distance between the primary light source 10 and the component 13 is between 1 and 10 mm. The phosphors 14 are known for their capability as a light converting medium, i.e. to convert at least a part of the primary light I of the light emitting diodes of a first wavelength to secondary light II of a second wavelength being different from the first wavelength. As an example, blue primary light may be partially converted to yellow light. The combination of the blue and yellow light provides for a white luminance W for an observer. Different conversions (i.e. second wavelengths) are possible, depending e.g. on the selected type(s) of phosphors. As an example, a plurality of different phosphors may be selected that convert the primary light I into secondary light II of different wavelength that mix to provide a white luminance W. It should be appreciated that off-white luminance may also be obtained, depending on the types of phosphors and the primary light.

The component 13 has a dome shaped configuration, wherein the primary light source 10 is disposed in the centre of the dome. A dome-shaped component 13 provides for an equal optical path for primary light I in the component 13, irrespective of the radial direction. The dome 13 may define an air chamber 15, such as to obtain a considerable difference between the refraction index of the dome 13 and the air chamber 15. However, the chamber 15 may also be filled with a substance having an appropriate difference in the refraction index as compared to the dome 13.

The phosphors 14 emit the secondary light II evenly in all directions. Therefore, a part of the emitted secondary light II will unavoidably be directed back into the direction of the primary light source 10 instead of to the outside. Without taking any measures, a considerable part of this secondary light II would be absorbed by the primary light source 10, thereby reducing the efficacy of the light emitting device 2. The absorption of the part of the secondary light II would be greater for smaller light emitting sources as a result of the larger relative area of the primary light source 10.

The purpose of the embodiment of FIGS. 3A and 3B is to substantially prevent that the part of the secondary light that is emitted back into the light emitting device 2 will be absorbed by the primary light source 10.

To that end, an optical structure 16 is integrally formed in the component 13. The optical structure 16 is arranged for receiving a part of the secondary light II from the phosphors 14, as shown in FIG. 3B, and is shaped for redirecting the part of the secondary light in a direction towards the substrate 11 but away from the primary light source 10. Therefore, absorption of the part of the secondary light II by the primary light source 10 can be substantially prevented.

In more detail, the optical structure 16 comprises a plurality of specifically designed surfaces 17 that are oriented such that the secondary light II generated by the phosphors 14 is refracted in a direction towards the substrate 11 but away from the primary light source 10. Another part of the secondary light II will experience total internal reflection at the surfaces 17 and may leave the component 13 without penetrating the air chamber 15.

As illustrated in FIGS. 3A and 3B, the orientation of these surfaces 17 varies along the component 13 in dependence of the angular position with respect to the primary light source 10. In particular, adjacent surfaces 17 are oriented perpendicularly to each other near the substrate 11, whereas the surfaces 17 define a smaller angle above the primary light source 10 (i.e. near the dome zenith).

The light emitting device 2 comprises a reflector 18 provided on or over the substrate 11. The reflector 18 may substantially surround the primary light source 10, as can be observed from FIG. 2. The part of the secondary light II that is redirected by the optical structure 16 is preferably directed to the reflector 18 in order to increase the probability that the secondary light II will eventually be output from the light emitting device 2, thereby increasing the luminous efficacy of the light emitting device 2.

The component 13 is preferably made of plastic (e.g. PC or PMMI) or silicon. These materials are relatively inexpensive and can relatively easily be molded to provide the optical structure 16. Alternatively, the component 13 is made of a ceramic material.

Phosphor(s) 14 may be added before molding the component 13 or at a later stage. The phosphors may also be coated at the outer side of the component 13, i.e. at the side facing away from the primary light source 10, forming a layer or shell over it.

It should be appreciated that various modifications of the embodiment of FIGS. 2, 3A and 3B have been envisaged.

Figure 4A:
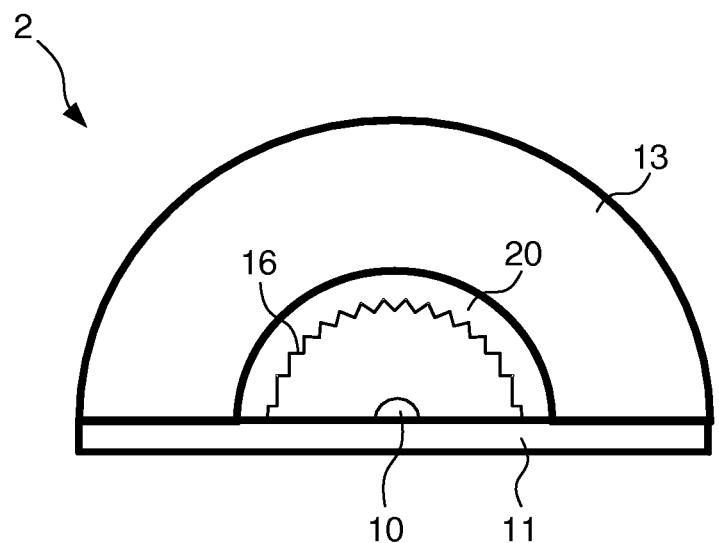
FIGS. 4A and 4B provide alternative embodiments of light emitting devices.

One example involves the application of a separate layer 20 attached to the component 13, as schematically illustrated in FIG. 4A. The separate layer 20 comprises the optical structure 16 to redirect the part of the secondary light II in a direction towards the substrate 11 but away from the primary light source 10, e.g. by refraction of the part of the secondary light.

Figure 4B:
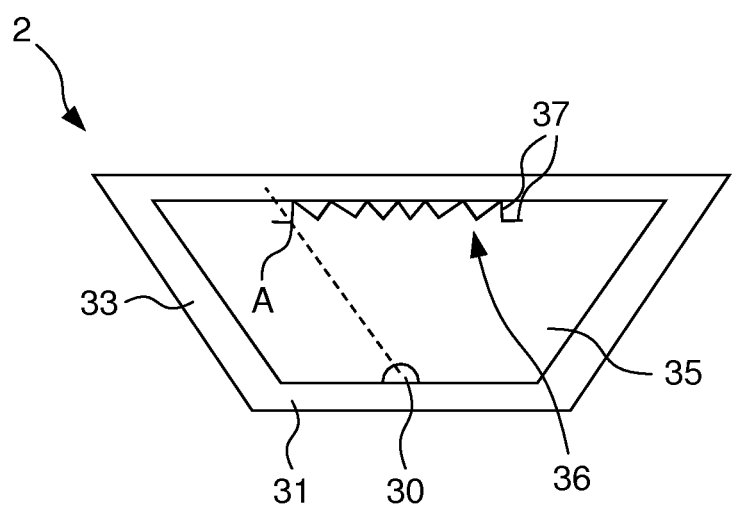

Another example involves a different configuration of the component 13, i.e. a configuration other than a dome-shaped component. FIG. 4B provides a schematic illustration of an inversely truncated pyramid component 33 provided with an optical structure 36 comprising surfaces 37 oriented such that secondary light will be directed towards the substrate 31 but away from the primary light source 30 as described above. The surfaces 37 are oriented such that adjacent surfaces 37 meet at a point A and a line drawn between the center of the primary light source 30 and the point A divides the sharp angle between the surfaces 37 in substantially equal parts. A chamber 35 exists filled with a substance, such as air, having a refractive index below that of the inversely truncated pyramid component 33.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A light emitting device comprising:
   a primary light source for emitting a primary light having a first wavelength, the primary light source being disposed in a first plane;
   a light converting medium arranged for converting at least a part of the primary light to secondary light having a second wavelength,
      wherein the second wavelength is different than the first wavelength,
      wherein the light converting medium is disposed in a second plane at a distance from the first plane; and,
   an optical structure, disposed between the first plane and the second plane, wherein the optical structure is arranged for receiving a part of the secondary light from the light converting medium and for redirecting the part of the secondary light in a direction towards the first plane and away from the primary light source,
   wherein the optical structure comprises a plurality of surfaces, the surfaces being oriented such that the part of the secondary light is redirected in the direction towards the first plane defining an area at least partially surrounding the primary light source.

2. The light emitting device according to claim 1, wherein the optical structure comprises a refractive structure.

3. The light emitting device according to claim 1, wherein the light converting medium and the optical structure form an integrated body.

4. The light emitting device according to claim 1, wherein a component at least partially surrounding the primary light source comprises the light converting medium.

5. The light emitting device according to claim 4, wherein the component is a dome-shaped component.

6. The light emitting device according to claim 4, wherein the component is comprised of plastic, ceramic or silicon material.

7. The light emitting device according to claim 1, further comprising a space defining an air-gap between the primary light source and the light converting medium.

8. The light emitting device according to claim 1, further comprising a reflector arranged for receiving the part of the secondary light redirected by the optical structure.

9. The light emitting device according to claim 7, wherein the reflector is arranged substantially in or parallel to the first plane at least partially surrounding the primary light source.

10. The light emitting device according to claim 1, wherein the primary light source comprises one or more light emitting diodes and wherein the light converting medium comprises at least one phosphor component.

11. The light emitting device according to claim 1, wherein the area at least partially surrounding the primary light source is a member that reflects the second light.

12. A light emitting device comprising:
   a primary light source for emitting a primary light having a first wavelength, the primary light source being disposed in a first plane;
   a light converting medium arranged for converting at least a part of the primary light to secondary light having a second wavelength,
      wherein the second wavelength is different than the first wavelength,
      wherein the light converting medium is disposed in a second plane at a distance from the first plane; and,
   an optical structure, disposed between the first plane and the second plane, wherein the optical structure is arranged for receiving a part of the secondary light from the light converting medium and for redirecting the part of the secondary light in a direction towards the first plane and away from the primary light source; and,
   a member encapsulating the light emitting device at least partially, wherein the member comprises at least one reflective surface arranged for reflecting light emitted by the light emitting device.

13. A method for manufacturing a light emitting device comprising the steps of:
   providing a primary light source on a carrier for providing primary light having a first wavelength;
   disposing a light converting medium at a distance from the carrier, the light converting medium being capable of converting at least a part of the primary light to secondary light having a second wavelength wherein the second wavelength is different than the first wavelength;
   providing an optical structure facing the primary light source, wherein the optical structure is arranged for receiving a part of the secondary light from the light converting medium and for redirecting the part of the secondary light in a direction towards the carrier and away from the primary light source; and,
   wherein the optical structure is shaped to provide a plurality of surfaces, the surfaces being oriented such that the part of the secondary light is redirected in the direction towards the first plane defining an area at least partially surrounding the primary light source.

* * * * *